United States Patent [19]

Cohen et al.

[11] Patent Number: 4,551,415

[45] Date of Patent: * Nov. 5, 1985

[54] PHOTOSENSITIVE COATINGS CONTAINING CROSSLINKED BEADS

[75] Inventors: Abraham B. Cohen, Springfield, N.J.; Vincent J. Webers, Wilmington, Del.

[73] Assignee: E. I. Du Pont de Nemours and Company, Wilmington, Del.

[ * ] Notice: The portion of the term of this patent subsequent to Nov. 8, 2000 has been disclaimed.

[21] Appl. No.: 611,870

[22] Filed: May 18, 1984

Related U.S. Application Data

[63] Continuation-in-part of Ser. No. 370,991, Apr. 22, 1982, abandoned.

[51] Int. Cl.[4] .................................................. G03C 1/68
[52] U.S. Cl. ...................................... 430/281; 430/260; 430/271; 430/905; 204/159.15
[58] Field of Search ................ 430/281, 905, 271, 260, 430/311; 428/402; 204/159.15

[56] References Cited

U.S. PATENT DOCUMENTS

| | | | |
|---|---|---|---|
| 3,148,064 | 9/1964 | Rauner et al. | 96/91 |
| 3,615,448 | 10/1971 | Yeshin | 96/33 |
| 3,825,430 | 7/1974 | Kurka | 96/115 R |
| 4,186,069 | 1/1980 | Muzyczko et al. | 430/175 |
| 4,276,366 | 6/1981 | McCartin et al. | 430/291 |
| 4,289,071 | 9/1981 | Hallman et al. | 101/395 |
| 4,414,278 | 11/1983 | Cohen et al. | 428/402 |

FOREIGN PATENT DOCUMENTS

| | | |
|---|---|---|
| 811040146 | 12/1981 | European Pat. Off. . |
| 1548764 | 7/1979 | United Kingdom . |
| 2046461 | 11/1980 | United Kingdom . |

*Primary Examiner*—Jack P. Brammer

[57] ABSTRACT

Photosensitive coating composition consisting essentially of an ethylenic unsaturated compound, a photoinitiator or photoinitiator system, an organic polymeric binder, discrete, substantially nonswellable, nonagglomerating, crosslinked beads, 0.1 to 4.0 μm in average diameter size, at least 90% of the beads by population below 6.0 μm, as defined and a solvent for the binder. The crosslinked beads can be present in positive-working systems. Preferred beads are trimethylolpropane triacrylate. The coating composition can be dried quickly into the form of a film which is useful as a dry film photoresist.

9 Claims, No Drawings

PHOTOSENSITIVE COATINGS CONTAINING CROSSLINKED BEADS

CROSS REFERENCE TO RELATED APPLICATION

This is a continuation-in-part of application Ser. No. 370,991, filed Apr. 22, 1982, now abandoned.

DESCRIPTION

1. Technical Field

This invention relates to photosensitive coating compositions. More particularly this invention relates to photosensitive compositions in which a portion of the binder component is replaced by crosslinked polymeric beads. This invention further relates to dry photosensitive film, containing crosslinked polymeric beads.

2. Background Art

Photopolymerizable compositions prepared from ethylenically unsaturated monomeric compounds, photoinitiators, organic polymeric binders as well as other additives are known to be useful for the preparation of dry film resists and for other uses. The components that are used in the preparation of the photopolymerizable compositions are generally mixed in a suitable solvent or solvents for the polymeric binder, and the composition is formed into a dry film by coating and removing the solvent, e.g., by extrusion coating, or other means to form dry films known to those skilled in the art.

Photopolymerizable compositions, particularly in dry layer form, are becoming increasingly popular for printing plates and photoresist films. Dry film photoresists, for example, have many advantages over liquid photoresists in the manufacture of printing circuits. In fact, dry film photoresists are becoming so popular that manufacturing capability of the plant may quickly be reached. One problem that occurs in the manufacture of photoresist films is the ability of such films to be dried quickly and efficiently. Drying of photopolymerizable coatings in a hot air dryer is influenced by many variables, e.g., thickness and solids concentration of the coatings, characteristics of the solvents, solvent interaction with the composition to be coated, temperature of the film, temperature of the air, air velocity, direction and turbulence, relative humidity, etc. Generally, drying may be considered to take place in two stages. In the first stage, the rate of drying is about the same as the rate for removal of pure solvent, the limiting factor is the rate at which solvent molecules can be removed from the surface (or from the air space above the surface) of the coating. The supply of heat energy to the coating and the air velocity are significant factors in this first drying stage. In the second stage, as the coating becomes more concentrated, drying slows down and is limited by the rate of diffusion of solvent molecules from the interior of the coating to the air surface of the coating. In this second drying stage not only are the temperature and air velocity important but some internal factors, e.g., the interaction between the solvent and solute, etc., are important as well.

In view of the many problems associated with the drying of photopolymerizable coatings, it is known that the temperature used to dry such coatings, should be less than the temperature at which bubbles form in the coating. The formation of bubbles is undesirable because once formed the bubbles may not collapse or if they do break the coating may be too viscous and uneven spots are formed in the layer. As a result dryers are usually arranged in zones, the temperature in each zone being held at some safe margin below the temperature that will cause bubbles to appear in the coating.

An additional limitation on the drying rate is the tendency of polymer solutions to "skin over". Too-rapid drying, especially in initial stages, results in formation of a substantially dry skin on the surface of the coating, but solvent-rich coating is still present below the skin which once dried does not readily redissolve in the underlying solvent. The skin thus acts as a barrier to solvent evaporation. This problem may be alleviated by slower drying, e.g., lower temperature, air velocity, adding a higher boiling solvent, etc. Slower drying, however, results in a slower production of photopolymerizable films and elements.

It has been found surprisingly that by replacing a portion of the dissolved polymeric binder of a photopolymerizable coating composition with crosslinked polymeric beads which are insoluble in the coating solvent dry photopolymerizable films and elements can be prepared more efficiently. The photopolymerizable layers of such films and elements dry more quickly with less risk of bubble formation. Production can thereby be increased even though there is no increase in actual size of the manufacturing facility. The photopolymerizable layer has been found to retain desirable properties in spite of the presence of the crosslinked polymeric beads since they can be designed to closely match the refractive index of the soluble polymeric binder thereby minimizing light scattering often associated with inorganic insoluble fillers. For example, the photographic speed, adhesion to copper, clarity or resolution, and flexibility of the photopolymerizable layer are maintained.

DISCLOSURE OF THE INVENTION

In accordance with this invention there is provided a photosensitive coating composition consisting essentially of (a) 5 to 45% by weight based on the weight of components (a) to (d) of at least one nongaseous, ethylenically unsaturated compound having at least one terminal ethylenic group, said compound being capable of forming a high polymer by free-radical initiated, chain-propagating addition polymerization;

(b) 0.05 to 10% by weight based on the weight of components (a) to (d) of an organic, radiation-sensitive, free-radical generating system, activatable by actinic radiation which initiates polymerization of the unsaturated compound;

(c) at least one organic polymeric binder;

(d) discrete, substantially nonswellable crosslinked polymeric beads having an average diameter in the range of 0.02 to 4.0 μm, wherein at least 90% of the beads by population are below 6 μm, the beads being insoluble and nonagglomerating in a solvent for the organic polymeric binder component, said crosslinked polymeric beads are taken from the class consisting of homopolymers and copolymers of monomers containing two or more free-radical polymerizable double bonds per molecule, and copolymers of at least one of said monomers and at least one monomer having one terminal ethylenic group, the total weight percent of the combination of components (c) and (d) based on the total weight of components (a) to (d) being 40 to 70% by weight, component (d) being present in an amount of 15 to 90% by weight based on the weight of components (c) and (d); and (e) at least one solvent for components (a), (b) and (c), the crosslinked polymeric beads being resistant to absorbing or being plasticized by any component or mixture of components of the coating composition, being mutually compatible with the dissolved ingredients a, b, c and e of the coating composition in which said beads are dispersed, and remaining dispersed therein as said coating is dried.

In accordance with another embodiment of this invention there is provided a positive-working photosensitive element comprising a support bearing a releasably bonded dry layer of a positive-working composition consisting essentially of the reaction product of (a) at least one photosolubilizable material and (c) at least one organic polymeric binder, components (a) and (c) being present in amounts of 50 to 95% and 5 to 50% by weight, respectively, based on the total weight of components (a) and (c); (b) a radiation-sensitive compound or system activatable by actinic radiation, 0 to 10% by weight based on the total weight of the composition; and (d) discrete, substantially nonswellable crosslinked polymeric beads having an average diameter in the range of 0.02 to 4.0 μm, wherein at least 90% of the beads by population are below 6 μm, the beads being insoluble and nonagglomerating in a solvent for the organic polymeric binder component, and remaining dispersed in said layer, the weight of component (d) being 20 to 65% by weight based on the total weight of the composition.

The photopolymerizable coating compositions of the invention consist essentially of at least one nongaseous ethylenically unsaturated compound containing at least one terminal ethylenic group (a), an organic, radiation-sensitive free-radical generating photoinitiator or photoinitiator system (b), at least one organic polymeric binder (c), discrete, substantially nonswellable crosslinked polymeric beads (d) which replace a portion of the polymeric binder component present in photopolymerization coatings, and at least one solvent (e) for the said components (a), (b) and (c). Minor amounts of other components can be present in the photopolymerizable compositions, e.g., dyes, thermal polymerization inhibitors, adhesion promoters, plasticizers, finely divided particles, etc. The photopolymerizable compositions retain their basic properties. For example, the photopolymerizable composition in layer form has an elongation to break of at least 200%, preferably at least 300%. In the positive-working coating composition the ethylenically unsaturated compound (a) is replaced by at least one photosolubilizable or photodesensitizable material which reacts with the organic polymeric binder component (c). Optionally a radiation-sensitive compound or system (b) can be present together with the discrete, substantially nonswellable, crosslinked polymeric beads (d). The coating compositions also contain at least one solvent (e) for components (a), (b) and (c).

As noted above, the photopolymerizable composition contains at least one addition polymerizable ethylenically unsaturated compound (a) having at least one polymerizable ethylenic group. Such compounds are capable of forming a high polymer by free-radical initiated, chain propagating, addition polymerization. Preferably, the unsaturated compound (also known as a monomeric compound) has at least two terminal ethylenically unsaturated groups, e.g., 2 to 4 groups. The monomeric compounds are nongaseous, i.e., at 20° C. and atmospheric pressure, have a normal boiling point above 100° C. and a plasticizing action on the organic polymer binder.

Suitable unsaturated monomeric compounds which can be used alone or in combination with other monomers include: t-butyl acrylate and methacrylate, 1,5-pentanediol diacrylate and dimethacrylate, N,N-diethylaminoethyl acrylate and methacrylate, ethylene glycol diacrylate and dimethacrylate, 1,4-butanediol diacrylate and dimethacrylate, diethylene glycol diacrylate and dimethacrylate, hexamethylene glycol diacrylate and dimethacrylate, 1,3-propanediol diacrylate and dimethacrylate, decamethylene glycol diacrylate and dimethacrylate, 1,4-cyclohexanediol diacrylate and dimethacrylate, 2,2-dimethylolpropane diacrylate and dimethacrylate, glycerol diacrylate and dimethacrylate, tripropylene glycol diacrylate and dimethacrylate, glycerol triacrylate and trimethacrylate, trimethylolpropane triacrylate and trimethacrylate, pentaerythritol triacrylate and trimethacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate and tetramethacrylate, 2,2-di-(p-hydroxyphenyl)-propane dimethacrylate, triethylene glycol diacrylate, polyoxyethyl-2,2-di-(p-hydroxyphenyl)-propane dimethacrylate, di-(3-methacryloxy-2-hydroxypropyl)ether of bisphenol-A, di-(2-methacryloxyethyl)ether of bisphenol-A, di-(3-acryloxy-2-hydroxypropyl)ether of bisphenol-A, di-(2-acryloxyethyl)ether of bisphenol-A, di-(3-methacryloxy-2-hydroxypropyl)ether of tetrachloro-bisphenol-A, di-(2-methacryloxy-ethyl)ether of tetrachloro-bisphenol-A, di-(3-methacryloxy-2-hydroxypropyl)ether of tetrabromo-bisphenol-A, di-(2-methacryloxyethyl)ether of tetrabromo-bisphenol-A, di-(3-methacryloxy-2-hydroxypropyl)ether of 1,4-butanediol, triethylene glycol dimethacrylate, polyoxypropyltrimethylol propane triacrylate, butylene glycol diacrylate and dimethacrylate, 1,2,4-butanetriol triacrylate and trimethacrylate, 2,2,4-trimethyl-1,3-pentanediol diacrylate and dimethacrylate, 1-phenyl ethylene-1,2-dimethacrylate, diallyl fumarate, styrene, 1,4-benzenediol dimethacrylate, 1,4-diisopropenyl benzene, and 1,3,5-triisopropenyl benzene. Also useful are ethylenically unsaturated compounds having a molecular weight of at least 300, e.g., alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of addition polymerizable ethylenic linkages particularly when present as terminal linkages. Preferred are those wherein at least one and preferably most of such linkages are conjugated with a double bonded carbon, including carbon double bonded to carbon and to such heteroatoms as nitrogen, oxygen and sulfur. Outstanding are such materials wherein the ethylenically unsaturated groups, especially the vinylidene groups, are conjugated with ester or amide structures. The unsaturated monomeric component is present in 5 to 45% by weight based on the total weight of the dry photopolymerizable layer.

Preferred free radical-generating addition polymerization initiators (b) activatable by actinic light and thermally inactive at and below 185° C. include the substituted or unsubstituted polynuclear quinones which are compounds having two intracyclic carbon atoms in a conjugated carbocyclic ring system, e.g., 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, benz(a)anthracene-7,12-dione, 2,3-naphthacene-5,12-dione, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone α-sulfonic acid or β-sulfonic acid, 3-chloro-2-methylanthraquinone, retenequinone, 7,8,9,10-tetrahydronaphthacene-5,12-dione, and 1,2,3,4-tetrahydrobenz(a)anthracene-7,12-dione. Other photoinitiators which are also useful, even though some may be thermally active at temperatures as low as 85° C., are described in U.S. Pat. No. 2,760,863 and include vicinal ketaldonyl alcohols, such as benzoin, pivaloin, acyloin ethers, e.g., benzoin methyl and ethyl ethers; α-hydrocarbon-substituted aromatic acyloins, including α-methylbenzoin, α-allylbenzoin and α-phenylbenzoin. Photoreducible dyes and reducing agents disclosed in U.S. Pat. Nos.: 2,850,445; 2,875,047; 3,097,096; 3,074,974; 3,097,097; and 3,145,104 as well as dyes of the phenazine, oxazine, and quinone classes; Michler's ketone, benzophenone, 2,4,5-triphenylimidazolyl dimers with hydrogen donors including leuco dyes, and mixtures thereof as described in U.S. Pat. Nos. 3,427,161; 3,479,185; and 3,549,367 can be used as initiators. Also useful with photoinitiators and photoinhibitors are sensitizers disclosed in U.S. Pat. No. 4,162,162. The photoinitiator or photoinitiator system is present in 0.05 to 10% by weight based on the total weight of the dry photopolymerizable layer.

The photopolymerizable composition contains at least one organic polymeric binder (c), e.g., polyacrylate and α-alkyl polyacrylate esters, e.g., polymethyl methacrylate and polyethyl methacrylate having an intrinsic viscosity in the range of 0.5 to 3.0; polyvinyl esters, e.g., polyvinyl acetate, polyvinyl acetate/acrylate, polyvinyl acetate/methacrylate and hydrolyzed polyvinyl acetate; ethylene/vinyl acetate copolymers; polystyrene polymers and copolymers, e.g., with maleic anhydride and esters; vinylidene chloride copolymers, e.g., vinylidene chloride/acrylonitrile; vinylidene chloride/methacrylate and vinylidene chloride/vinyl acetate copolymers; polyvinyl chloride and copolymers, e.g., polyvinyl chloride/acetate; saturated and unsaturated polyurethanes; synthetic rubbers, e.g., butadiene/acrylonitrile, acrylonitrile/butadiene/styrene, methacrylate/acrylonitrile/butadiene/styrene copolymers, 2-chlorobutadiene-1,3 polymers, chlorinated rubber, and styrene/butadiene/styrene, styrene/isoprene/styrene block copolymers; high molecular weight polyethylene oxides of polyglycols having number average molecular weights from about 4,000 to 1,000,000; epoxides, e.g., epoxides containing acrylate or methacrylate groups; copolyesters, e.g., those prepared from the reaction product of a polymethylene glycol of the formula $HO(CH_2)_nOH$, where n is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids; nylons or polyamides, e.g., N-methoxymethyl polyhexamethylene adipamide; cellulose esters, e.g., cellulose acetate, cellulose acetate succinate and cellulose acetate butyrate; cellulose ethers, e.g., methyl cellulose, ethyl cellulose and benzyl cellulose; polycarbonates; polyvinyl acetal, e.g., polyvinyl butyral, polyvinyl formal; polyformaldehydes.

The binder may also contain sufficient acidic or other groups to render the composition processible in aqueous developer. Useful aqueous-processible binders include those disclosed in U.S. Pat. No. 3,458,311 and in U. K. Pat. No. 1,507,704. Useful amphoteric polymers include interpolymers derived from N-alkylacrylamides or methacrylamides, acidic film-forming comonomer and an alkyl or hydroxyalkyl acrylate such as those disclosed in U.S. Pat. No. 3,927,199. These patents are incorporated by reference. The number average molecular weight (Mn) of the polymeric binder (and other polymers present) is determined by gel permeation chromatography employing a polybutadiene standard or other standard known to those skilled in the art.

In the photopolymerizable composition are present discrete, substantially nonswellable crosslinked polymeric beads (d). The beads replace 15 to 90% by weight of the total amount of binder that is ordinarily used in a photopolymerizable composition. Therefore some properties of the beads as discussed below must be similar to those of the binder present in the photopolymerizable composition but unlike the binder they are insoluble and substantially nonswellable in the solvent; monomer, plasticizer or other component that may be present in the coating composition. The beads function as part of the binder. They are mutually compatible in the photopolymerizable composition in the broad sense, i.e., "exist together in harmony" with the other components, but are not compatible in the narrow sense, i.e., "form a homogeneous mixture", since this implies mutual solubility. Thus the binder and beads have a mutual affinity; the binder/monomer combination prior to exposure or the binder/polymerized monomer after exposure wets, adheres or interacts with the surface of the beads. Poor affinity of the photopolymerizable composition for the beads, i.e., nonwetting of the beads or nonadhesion to the beads, would result in points of weakness in a dry film prepared from such composition and cannot be tolerated. The beads are uniformly dispersed throughout the coating composition and remain dispersed therein as said coating is dried. They also have a negligible effect on the clarity of the coating. The relatively small particle size of the beads specified below is important so that variations in refractive index between the beads and the remainder of the photopolymerizable coating before or after imagewise exposure thereof are not significant.

The most direct way to insure mutual affinity between the binder and the beads is that they contain groups of generally similar chemical nature or polarity, e.g., oxygen-containing groups or aromatic groups. For example, polyester, polyether, polyacid, polyols, etc. binders would preferably use polyacrylate homopolymer or copolymer beads; polycarboxylic acid binders would preferably use beads having a carboxyl surface; polystyrene/polybutadiene/polystyrene block copolymer binders would preferably use beads rich in divinyl benzene.

With regard to solubility the beads (d) and the binder (c) are quite different. The binder (c) is soluble in the solvent (e) for the coating and is compatible with or mutually soluble in the monomer (a), initiator (b) and optional ingredients such as plasticizer or dye. The beads, however, do not dissolve in the solvent, are resistant to absorbing or becoming plasticized by the monomer, other components of the photopolymerizable composition or mixture of components, and are resistant to being swollen with any of the solvent or components of the photopolymerizable composition, e.g., at or below room temperature or at elevated temperature present during exposure or used in drying, e.g., temperatures up to 200° to 500° F. (93° to 260° C.).

The principal reason why the beads should not swell or dissolve in a solvent is that this would adversely affect the drying rate. In addition, beads swollen by solvent or the other components of the photopolymerizable composition become tacky and aggregate thus increasing their particle size which results in unclear films due to light scattering, or protrusion from the surface to give a matte rather than smooth surface in the dried photopolymerizable layer. Swelling of the beads may result in precipitation or coalescence of the beads in the coating composition. Swelling of the beads by the monomer or other component in the dry photopolymerizable layer will extract monomer, photoinitiator, etc. from the monomer/binder phase, possibly over a protracted period of time, to give changes in physical or sensitometric characteristics which would be undesirable in a photopolymerizable element.

The substantially nonswellable crosslinked polymeric beads have an average diameter in the range of 0.02 to 4.0 μm, preferably 0.1 to 4.0 μm, wherein at least 90% of the beads by population are below 6.0 μm, the beads being insoluble and nonagglomerating in the solvents described below. The crosslinked nonswellable polymeric beads can be homopolymers or copolymers of monomers containing two or more free-radical polymerizable double bonds per molecular, e.g., di, tri-, tetra acrylate monomers, di-, tri-, tetramethacrylate monomers, and copolymers of at least one of said monomers and at least one monomer having one terminal ethylenic group. Preferred crosslinked nonswellable polymeric beads are taken from the class consisting of homopolymers of tri- and tetraacrylate and tri- and tetramethacrylate monomers, copolymers of said tri- and tetraacrylate and tri- and tetramethacrylate monomers, copolymers of at least one of said tri- and tetraacrylate or said tri- and tetramethacrylate monomers and up to 25% by weight of at least one monomer having one terminal ethylenic group, copolymers of at least one of said tri- and tetraacrylate or said tri- and tetramethacrylate monomers and up to 75% by weight of at least one monomer having two terminal ethylenic groups or three terminal ethylenic groups different from said triacrylate or trimethacrylate monomers. If the crosslinked beads absorb any appreciable amount of the coating solvent, the rapid-drying effect will be lost, because it will take the solvent a longer time to be removed from the beads and therefore from the composition containing the beads. It is therefore essential to the invention that the beads should be substantially nonswellable by solvent. The preparation of the preferred crosslinked nonswellable polymeric beads and a test for possible swelling of beads are described in Cohen and Lazaridis U.S. Pat. No. 4,414,278. Also useful are crosslinked polymeric beads which have their surface hydrolyzed. This can be accomplished by treatment of the polymeric beads containing ester linkages with sodium hydroxide, potassium hydroxide or other alkaline reagents.

Additional useful crosslinked polymeric beads include: polymers and copolymers among diacrylates and dimethacrylates of dihydroxy compounds, e.g., diethylene glycol, triethylene glycol, tetramethylene glycol, bisphenol-A, etc., e.g., tetraethylene glycol dimethacrylate, trimethylolpropane triacrylate/styrene (up to 25%), trimethylolpropane triacrylate (25 to 10)/triethyleneglycol diacrylate (75 to 90), triethylene glycol dimethacrylate/methylmethacrylate (up to 25%), tetraethylene glycol dimethacrylate/methylmethacrylate (up to 25%), divinyl benzene, 1,3,5-trivinyl benzene, triacryloxy cyanurate, triallyl cyanurate, triacryloxybenzene, e.g., phloro, glucinol triacrylate; and polymers derived from: acrylates and methacrylates of polyhydroxy compounds such as mannitol, inositol and sucrose, etc.

The total weight percent of the combination of organic polymeric binder (c) and crosslinked beads (d) based on the total weight of components (a) to (d) is 40 to 70% by weight. The crosslinked beads (d) are present in an amount of 15 to 90% by weight based on the combined weight of components (c) and (d). As noted in Control Example 1 below the molecular weight of the organic polymeric binder has a bearing on the amount of crosslinked beads that can be present. The preferred weight percentage of crosslinked beads (d) depends on the molecular weight of the binder component (c), e.g., with the major portion of the binder having a number average molecular weight up to 40,000, 15 to 40% by weight beads is useful, with the major portion of the binder having a number average molecular weight over one million (high molecular weight binders), 30 to 90% by weight beads is useful.

In preparing the photopolymerizable compositions a solvent or mixture of solvents (e) for the organic polymeric binder is present. Useful solvents include: methylene chloride, 2-ethoxyethanol, methanol, acetone, methyl ethyl ketone, 1,1,1-trichloroethane, methyl isobutyl ketone, etc., or a combination of these solvents. The solvent is present in an amount of 45 to 95% by weight based on the weight of components used to prepare the photopolymerizable composition. The solvent is removed by drying, e.g., with hot air dryers, as is known to those skilled in the art.

Not all combinations of solvents and crosslinked beads may be suitable for securing rapid drying. For example, beads that are made by polymerization of a significant proportion of acrylates and methacrylates of polyethylene glycol, e.g., triethyleneglycol diacrylate or tetraethyleneglycol dimethacrylate, will still swell in methylene chloride. Such swellable combinations outside the scope of the invention may be found by applying the test for possible swelling of Cohen and Laziridis U.S. Pat. No. 4,414,278 referred to above. If the test shows that the combination is swellable, either the type of beads may be changed, e.g., use poly-trimethylolpropane triacrylate beads instead of poly-triethyleneglycol diacrylate, or the solvent may be changed, e.g., use 1,1,1-trichloroethane instead of methylene chloride to obtain a nonswellable combination.

In addition to the above major components of the photopolymerizable composition optionally minor amounts of the following components can also be present. Various colorants, e.g., dyes and pigments may be added to increase the visibility of the image. Photosensitive dye precursors may be incorporated to give a visible image upon exposure. Any colorant used, however, should preferably be transparent to the actinic radiation used. Pigments can also be incorporated in the discrete, substantially nonswellable crosslinked beads which isolates them from chemical interaction with the photochemical system.

Preferred thermal polymerization inhibitors which may be present include: p-methoxyphenol, hydroquinone, and alkyl and aryl-substituted hydroquinones and quinones, tert-butyl catechol, pyrogallol, copper resinate, naphthylamines, β-naphthol, cuprous chloride, 2,6-di-tert-butyl-p-cresol, phenothiazine, pyridine, nitrobenzene and dinitrobenzene, p-toluqinone and chloranil and the nitroso compositions disclosed in U.S. Pat. No. 4,168,982. Inhibitors, when used, are present in an amount of 0.001 to 2.0% by weight of the photopolymerizable composition.

Adhesion promoters are also useful in the photopolymerizable composition. Exiamples of such adhesion promoters include a small amount of a nitrogen-containing compound of the formula

where R is orthoaromatic hydrocarbon nucleus, e.g., benzene or naphthalene; X is $CH_2$, NH, S, O, or Se; Z is N or C-Y and Y is H, $NH_2$, alkyl of 1 to 4 carbon atoms or halogen, e.g., Cl or Br. A preferred compound is benzotriazole. The adhesion promoter when used can be present in amounts of at least 0.001% by weight of the monomer and binder component of the photopolymerizable composition. Suitable compounds are disclosed in Hurley et al. U.S. Pat. No. 3,622,334 which is hereby incorporated by reference.

One or more plasticizers compatible with the photopolymerizable composition may be present therein to facilitate selective development, improve elasticity or reduce lamination temperature of the dry film. Examples of plasticizers include: dialkyl phthalate, polyethylene glycol, alkyl phosphates, etc.

If desired, the photopolymerizable compositions can contain immiscible inorganic fillers or reinforcing agents which have a particle size in the range of 0.1 to 2.0 μm and are essentially transparent at the wavelengths used for exposure of a layer of the photopolymerizable composition and which do not scatter actinic radiation, e.g., organophilic silicas, silica, powdered glass, etc. Such materials are used in amounts varying with the desired properties of the photopolymerizable compositions. The fillers are useful in improving the strength and stiffness of the photopolymerizable layer.

As indicated above positive-working photosensitive coating compositions containing crosslinked beads can be prepared using: (a) photosoluble polymers with pendent diazo quinone groups prepared as described in U.S. Pat. No. 3,837,860; (b) photodesensitizable polymers prepared by mixing a bis-diazonium salt with a polymer having pendent hydroxyl or amino groups as described in U.S. Pat. No. 3,778,270, (c) photosensitive compositions containing as one component dihydropyridine as described in U.S. Pat. No. 4,271,260, the disclosures of which are incorporated by reference. Photosolubilizable and photodesensitizable resist compositions are disclosed in U.S. Pat. No. 4,193,797, column 4, line 19 to column 5, line 68, the disclosure of which is incorporated by reference.

Photopolymerizable coating compositions containing crosslinked beads can be prepared as follows: the beads are dispersed with moderate shear in part of the solvent thereby breaking up any loose aggregations of particles that may be present. The dispersion is then combined with the remainder of the solvent and the other ingredients set forth above and in the examples below are added with stirring. The amount of solvent used depends to some extent on the method of coating the photopolymerizable coating composition.

The photopolymerizable coating composition, e.g., prepared as described above or by other methods, is filtered, e.g., by passing through an in-line filter with a pore size of 10 μm. The filtered solution may be pumped to a coating apparatus such as a skim coater which may be equipped with an air knife to control coating weight, an extrusion die, a gravure roll, a wirewound rod, or other coating means known to those skilled in the art. The photopolymerizable coating composition can be applied uniformly to a moving web of film which passes by the coating unit in an appropriate geometrical relationship. The coated web is passed into a drier, usually equipped with a heated forced draft air supply where the air velocity, direction and temperature are controlled to remove the solvent in the coating. The dry web is wound, e.g., on suitable rolls. At the time of windup, a cover sheet may be laminated to the dry photopolymerizable surface. Other procedures known to those skilled in the art can be used to prepare the dry photopolymerizable film.

As indicated previously, in preparing dry film photoresist elements, an image-yielding photopolymerizable stratum on a strippable support is preferably used. The remaining surface of the supported, photopolymerizable stratum may be protected by a removable cover sheet or when the element is stored in roll form, the stratum surface may be protected by the contiguous reverse surface of the support. The photopolymerizable composition is present in a dry coating thickness of about 0.0003 inch (~0.0008 cm) to about 0.01 inch (~0.025 cm) or more. A suitable strippable support which preferably has a high degree of dimensional stability to temperature changes, may be chosen from a wide variety of films composed of high polymers, e.g., polyamides, polyolefins, polyesters, vinyl polymers, and cellulose esters, and may have a thickness of from 0.00025 inch (~0.0006 cm) to 0.008 inch (~0.02 cm) or more. If exposure is to be made before removing the strippable support, it must, of course, transmit a substantial fraction of the actinic radiation incident upon it. If the strippable support is removed prior to exposure, no such restrictions apply. A particularly suitable support is a transparent polyethylene terephthalate film having a thickness of about 0.001 inch (~0.0025 cm).

When the element contains no removable, protective cover sheet and is to be stored in roll form, the reverse side of the strippable support preferably has applied thereto a thin release layer of a material, such as wax or silicone, to prevent blocking with the photopolymerizable stratum. Alternatively, adhesion to the coated photopolymerizable layer may be preferentially increased by flame treating or electrical discharge treating the support surface to be coated.

Suitable removable, protective cover sheets when used may be chosen from the same group of high polymer films described above and may have the same wide range of thicknesses. A cover sheet of 0.001 inch (~0.0025 cm) thick polyethylene is especially suitable. Supports and cover sheets as described above provide good protection to the photopolymerizable resist layer.

Generally, suitable substrates for the process of the invention involving printed circuit formation are those which have mechanical strength, chemical resistance and good dielectric properties. Thus, most board materials for printed circuits are thermosetting or thermoplastic resins usually combined with a reinforcing agent. Thermosetting resins with reinforcing fillers are ordinarily used for rigid boards, whereas thermoplastic resin without reinforcements are usually used for flexible circuit boards.

Typical board construction involves combinations such as phenolic or epoxy resins on paper or a paper-glass composite, as well as polyester, epoxy, polyimide, polytetrafluorethylene, or polystyrene on glass. In most instances, the board is clad with a thin layer of electroconductive metal of which copper is by far the most common.

Suitable substrates for the process of the invention involving preparation of lithographic printing plates are those which have mechanical strength and surfaces which differ in hydrophilicity or oleophilicity from the surfaces of the imaged photosensitive areas thereon formed by laminating a photosensitive layer, exposing and developing said layer. Such substrates are disclosed in U.S. Pat. No. 4,072,528. While numerous substrates are satisfactory for this purpose thin anodized aluminum plates such as those disclosed in U.S. Pat. No. 3,458,311 are particularly useful. Anodized and silicated aluminum plates are also useful.

It will be recognized by those skilled in the art that it will be preferable for the printed circuit substrate surface which is to be laminated to be clean and free of any extraneous material. For this reason, it will frequently be desired to clean printed circuit substrates prior to lamination by one or more of the several cleaning processes which are well-known in the field of printed circuit board manufacture. The particular type of cleaning depends upon the type of contamination, e.g., organic, particulate or metallic. Such methods include degreasing with solvents and solvent emulsions, mechanical scrubbing, alkaline soaks, acidification and the like, followed by rinsing and drying.

After preparation of the element and lamination of the photopolymerizable layer to a printed circuit board if the element is to be used as a dry photoresist, the photopolymerizable layer is imagewise exposed to actinic radiation through a suitable image, e.g., image bearing transparency, positive or negative or a suitable photomask. The source of actinic radiation generally furnishes an effective amount of radiation in the ultraviolet range. Suitable sources include: carbon arcs, mercury-vapor arcs, fluorescent lamps with special ultraviolet-emitting phosphors, argon glow lamps, electronic flash units and photographic flood lamps, etc. The amount of exposure required for satisfactory reproduction of a given photopolymer layer is a function of exposure time, type of radiation source used, and distance between the radiation source and layer surface. In general, exposure times range from 0.5 to 10 minutes or more using standard commercial radiation sources.

After imagewise exposure the unexposed areas of the photopolymerized layer are removed by liquid development, e.g., a solvent or solvent mixture for the organic polymeric binder component. The development may occur in any convenient manner, e.g., by pouring, immersion, spraying, or roller application. Brushing may aid in removal of the unpolymerized or uncrosslinked portions of the composition. Development can occur with warm solutions and the time varies depending on the photopolymerizable layer, e.g., its composition, thickness, etc. Useful development ranges can be in the range of from 5 seconds to 25 minutes. After development the element can be dried, if necessary, e.g., in air including placing in front of a fan.

A preferred embodiment of the photopolymerizable composition is illustrated in Example 1, wherein the crosslinked polymeric beads are homopolymers of trimethylolpropane triacrylate.

INDUSTRIAL APPLICABILITY

The photopolymerizable compositions of this invention having a portion of the organic polymeric binder replaced by the discrete, substantially nonswellable crosslinked beads have been found to dry appreciably faster than a similar photopolymerizable composition containing none of the crosslinked beads. The photopolymerizable compositions of the invention can be manufactured into dry film photoresists or dry photopolymerizable elements more quickly and efficiently than the compositions of the prior art. The dry photoresists are used in the preparation of printed circuits. Such photoresists are capable of being processed more rapidly. In element form a layer of the dry photopolymerizable composition is present between a support, e.g., film or sheet, and a removable cover sheet. Such an element when used to prepare a printing plate may have the support permanently adhered to the photopolymerizable layer. When the element is used as a dry film photoresist the support is capable of being removed from the photopolymerizable layer without damage thereto. The photopolymerizable layer retains desirable properties even though the crosslinked polymeric beads are present in relatively large amounts. Thus the photographic speed, adhesion to copper, clarity or resolution and flexibility of the photopolymerizable layer of the invention are retained.

While the photopolymerizable coating compositions containing the discrete, substantially nonswellable crosslinked beads are negative-working systems, similar advantages would apply for photosensitive compositions containing positive-working photosensitive systems provided that the same critical criteria for the solvent soluble binder and crosslinked beads described above are met.

The use of the crosslinked beads in positive-working photosensitive coating compositions and as dry film elements is particularly advantageous where the photosensitive films are being designed for use as photoresist films in making printed circuit boards. Such films are generally thicker than positive-working coatings used for microelectronic applications. It is therefore advantageous to be able to coat and dry these relatively thick coatings rapidly to achieve superior physical properties in the resulting dry film elements. Useful types of positive-working dry film formulations particularly useful as dry film resists are described in Cohen et al. U.S. Pat. No. 4,193,797 and Abele et al. U.S. Pat. No. 4,271,260. These patents are incorporated by reference.

Positive-working coating compositions which are based on photosolubilization of diazo quinone compounds are also useful with the discrete, substantially nonswellable crosslinked beads described herein. The diazo quinone compounds would be used in place of the ethylenically unsaturated compound normally present in negative-working photopolymerizable compositions.

The separate photoinitiating system necessary in the negative-working compositions is often not required.

EXAMPLES

The invention is illustrated by but is not intended to be limited to the following examples wherein the parts and percentages are by weight. The polymeric molecular weights are number average molecular weights. Inherent viscosity is measured on a solution containing 0.25 g of polymer in 50 ml of methylene chloride, at 20° C. using a Cannon-Fenske viscometer. The intrinsic viscosity set forth in the examples is determined by extrapolation of specific viscosity to zero concentration. Specific viscosity is $(n-n_o)/n_o$ where n is the viscosity of the solution and $n_o$ is the viscosity of pure solvent both determined at 25° C. using an Ostwald viscosimetric pipette. The elongation to break of dry photopolymerizable layers is determined according to ASTM D412-75. Samples of the coating compositions are coated on film supports using a 0.008 inch (0.20 mm) doctor knife and dried at room temperature for 48 hours. The coating samples are stripped from their supports and are laminated together to provide a layer thickness of about 0.006 inch (about 0.15 mm) unless otherwise stated. A 1 inch by 3 inch (2.54 cm by 7.62 cm) piece of the laminate is placed in the jaws of an Instron ® Tester Model TM at initial separation of one inch (2.54 cm) with a crosshead speed of one inch/minute (2.54 cm/minute).

EXAMPLE 1

A. Preparation of Beads:

To a one-liter beaker containing 500 g of trimethylolpropane triacrylate, 193 ppm of hydroquinone and 130 ppm of p-methoxyphenol was added 5.7 g of benzoyl peroxide. The mixture was stirred at room temperature until the benzoyl peroxide was dissolved, and the solution was used within an hour after solution was complete. A solution of 2.5 g of sodium di-octyl sulfosuccinate and 4.2 g of a surfactant (Hostapon ®THC, manufactured by American Hoechst, Somerville, N.J.) containing 2.5 g of the sodium salt of oleyl methyl tauride in 1200 ml of water was prepared in a stainless steel beaker. The solution was stirred at low speed with a ½ horsepower Eppenbach mixer while the peroxide/monomer solution was added. The speed of the mixer was then slowly increased (over a period of about 10 minutes) by raising the input voltage of the mixer to about 70 volts. The speed was held at this point for about one hour. The stainless steel can containing the creamy white emulsion was then covered and held in a water bath at 60° C. for 72 hours. The polymerized emulsion was allowed to cool and centrifuged. The supernate was discarded and the polymer cake was stirred with about one liter of water and centrifuged again. The stirring with water and centrifuging was repeated twice more, and the cake of polymer beads was allowed to air dry. The dried polymer was easily redispersed either in water or in organic solvents such as methylene chloride, acetone or ethanol by using a household type blender-homogenizer at low speed. The mean particle size based on population determined using a Coulter Counter manufactured by Coulter Electronics, Inc., Hialeah, Fla. was 0.66 μm and the mean volume particle size was 1.2 μm.

B. Preparation of Coating Dispersions for Photoresist

A stock dispersion of beads in methylene chloride was made by stirring together 26.8 parts of the dried beads, prepared as described above, and 66.6 parts of methylene chloride. The dispersion was filtered through a nylon felt filter pad with substantially no retention of solid material and 5.5 parts of polymethylmethacrylate having an inherent viscosity of 1.25 and 1.2 parts of polymethylmethacrylate having an inherent viscosity of 0.5 were dissolved in the suspension. The polymers were added to increase the stability of the dispersion, but this was found not to be necessary.

Coating compositions were prepared containing the ingredients listed in Table 1. Coating dispersion A containing no crosslinked beads was used as a control. In coating dispersions B and C, 40% and 20% respectively, of the total weight of binder and beads was crosslinked beads. This corresponds to about 24.24 and about 12.12%, respectively, based on the total weight of components (a), (b), (c) and (d).

TABLE 1

| COATING FORMULATIONS | | | |
|---|---|---|---|
| Ingredient | A | B | C |
| Methylene chloride | 10728 | 10728 | 10728 |
| 2-Ethoxyethanol | 1192 | 1192 | 1192 |
| Polymethylmethacrylate[1] | 3270 | 1962 | 2616 |
| Polymethylmethacrylate[2] | 700 | 420 | 560 |
| Crosslinked beads as described above | — | 1588 | 794 |
| Trimethylolpropane triacrylate | 1050 | 1050 | 1050 |
| Tetraethylene glycol diacrylate | 1050 | 1050 | 1050 |
| Michler's ketone | 8.4 | 8.4 | 8.4 |
| Benzophenone | 280 | 280 | 280 |
| Bis(2-o-chlorophenyl-4,5-bis-phenyl) imidazole | 175 | 175 | 175 |
| Tris-(4-diethylamino-o-tolyl) methane | 10.5 | 10.5 | 10.5 |
| 4,4′4″-Methylidyne tris (N,N—dimethyl aniline) | 7.0 | 7.0 | 7.0 |
| Victoria Green, C.I. Pigment Green 18 | 2.45 | 2.45 | 2.45 |
| Monastral Green Pigment, C.I. Pigment Green 7 | 7.80 | 7.80 | 7.80 |
| Mixture of ortho and para-toluene sulfonamide | 420.0 | 420.0 | 420.0 |
| Benzotriazole | 14.0 | 14.0 | 14.0 |
| p-Toluene sulfonic acid | 3.5 | 3.5 | 3.5 |
| Total | 18919.0 | 18919.0 | 18919.0 |

[1] Inherent viscosity 1.25
[2] Inherent viscosity 0.50

The solutions were each extrusion coated to give a dry coating thickness of 50.8 μm. Samples were coated at 4.57 m/min; pump speeds were adjusted in each case until the dry coating thickness was 50.8 μm. Pump speeds were then calculated to secure the same coating thickness at 6.10, 7.62, 9.14 and 10.67 m/min. Subsequent thickness measurements confirmed the constant coating thickness. After coating, the coated web was led into a three-chambered dryer. Temperatures in the three successive chambers were held at 38°, 66° and 121° C. Air velocities and temperatures in the three zones were held constant throughout the drying. Upon exiting from the dryer, the coated web was laminated with polyethylene film, 25 μm thick, and wound up. All of the coatings from a given coating dispersion were successively wound on the same core. Immediately after the last coating (at the fastest coating speed), samples were taken. A 7-10 meter sample of each coating was wound on a core which had been previously covered with aluminum foil, and after winding the sample, aluminum foil was wrapped around the outside to prevent escape of any solvent vapor. Samples were analyzed for residual solvent by a procedure based on heating a sample of the coated material in a closed volume, and analyzing the vapor obtained by infrared absorption for the two solvents present, methylene chloride and 2-ethoxyethanol. The percentage of the residual amount of each solvent was then calculated and is shown in Table 2.

TABLE 2

Residual Solvent from Coatings Made at Various Coating Speeds

| Coating Speed (m/min) | Coating Dispersion A | | Coating Dispersion B | | Coating Dispersion C | |
|---|---|---|---|---|---|---|
| | M | E | M | E | M | E |
| 4.57 | 0.19 | 0.19 | 0.02 | 0.02 | 0.12 | 0.13 |
| 6.10 | 0.47 | 0.24 | 0.03 | 0.03 | 0.14 | 0.15 |
| 7.62 | 0.42 | 0.22 | 0.05 | 0.04 | 0.12 | 0.16 |
| 9.14 | 0.35 | 0.28 | 0.09 | 0.16 | 0.28 | 0.20 |
| 10.67 | 0.88 | 0.38 | 0.17 | 0.16 | 0.42 | 0.27 |

M is percent methylene chloride content
E is percent 2-ethoxyethanol content

From Table 2, it can be seen that there is a marked difference between the amounts of residual solvent obtained from Coating Dispersion B at any stated coating speed and those of Coating Dispersion A. The amount of residual solvent obtained from Coating Dispersion A at 4.57 m/min is greater than that obtained when Coating Dispersion B is coated at 10.67 m/min, i.e., more than twice as fast. Coating Dispersion B, in which 40% of the total weight of polymeric binder and beads was crosslinked polymer beads, required less than half as much time to dry as Coating Dispersion A (control) to the extent that the total residual solvent was reduced to less than about 0.4%. Coating Dispersion C, in which 20% of the total weight of polymeric binder and beads was crosslinked polymer beads, gave results intermediate between those from Coating Dispersions A and B. Coatings from Coating Dispersion A contained bubble defects ranging from 0.3/dm$^2$ when coated at 4.57 m/min to 20/dm$^2$ when coated at 10.67 m/min. No bubble defects were found in coatings from Coating Dispersions B and C.

Samples of Coating Dispersions A, B and C, each made at 4.57 m/min were tested as dry film photoresists. Lamination of the dry films to copper was conducted at 220° F. (104.4° C.). The film flexibility, photospeed, image quality, etching results with FeCl$_3$ and plating with copper were substantially the same for each of the three photoresists. The development times required for photoresists prepared from Coating Dispersions A and B were as follows:

| | Time (seconds) |
|---|---|
| Coating Dispersion A | 105 |
| Coating Dispersion B | 68 |

The development occurred in a spray processor wherein the dry film laminate is held and methyl chloroform solvent is pumped to spray nozzles therein to deliver the solvent in a broad pattern with a moderately high velocity. The elongation to break of dry coating A, B and C was as follows:

| | Elongation to Break (%) |
|---|---|
| A | 360 |
| B | 670 |
| C | 437 |

EXAMPLE 2

A. Procedure

Crosslinked polymeric beads were treated to hydrolyze surface ester groups to carboxyl groups. 40.0 Gram portions of beads prepared as described in Example 1 were stirred with 48.4 g of 4% aqueous sodium hydroxide for 5 hours at room temperature (H); with 33.3 g of 10% aqueous sodium hydroxide for 20 minutes at 45°-57° C. (I); with 48.4 g of 4% aqueous sodium hydroxide for 40 minutes at 57°-62° C. (J), with 48.4 g of 4% aqueous sodium hydroxide for 50 minutes at 60°-65° C. (K) and with 48.4 g of 4% aqueous sodium hydroxide for about four hours at 60°-70° C. (L). After the treatment each slurry was poured into about 100 ml of ice-cold water and centrifuged. The viscosity of the supernatant liquid was measured with an Ostwald pipette. The viscosities do not differ significantly from the viscosity of similarly diluted sodium hydroxide (less than 1.2 cps), except for sample L, which had a viscosity of 13.4 cps. This indicated that hydrolysis was restricted to the surface in samples H to K, but that in sample L, the hydrolysis had gone too far, resulting in polymer (polyacrylic acid) in solution. The centrifuged beads were washed four times by stirring with 120 ml of water and recentrifuging. The washed samples were then allowed to dry. The presence of carboxyl groups in the samples was demonstrated by stirring 0.1 g of the dry powder with one or two milliliters of water and then adding 10.0 ml of a solution of 0.1 g of methylene blue and 20 ml of pH7 buffer in 80 ml of water. The mixture was centrifuged, the supernate was discarded, and the precipitate was washed three times by stirring with 35 ml of water and recentrifuging. The precipitate was then dried on filter paper. The depth of blue color increased in the order H to K; sample H was pale blue and sample K was quite dark.

B. Preparation and Use of Beads of the Invention

Samples were prepared like sample K above except in 500 g batches. A solution of 41.6 g of sodium hydroxide in 375 ml of water was heated to 70° C. and 500 g of polymeric beads as described in Example 1 were added with stirring. The temperature was raised from the resultant 53° to 60° C. over 7 minutes and the slurry formed was stirred at 60°-65° C. for 50 minutes. The slurry was added to 1500 ml of ice water and then centrifuged. Viscosity of the supernate was not significantly different from that of similarly diluted aqueous sodium hydroxide. The precipitate was stirred with about one liter of water and the pH adjusted to 2.5 to give carboxylic acid groups on the surface. The slurry was further diluted to about four liters and centrifuged. The beads were washed four times by diluting to about four liters and recentrifuging, and finally were air dried. Yield was about 480 g.

A comparison was made of the drying rate of a control composition as in Coating Dispersion A of Example 1, and a composition like Coating Dispersion B of Example 1 except that instead of the polymeric beads of that example, 40% of the total weight of polymer binder and beads was beads with a carboxyl (hydrolyzed) surface made as described above. The results were similar to those of Example 1, the composition containing the crosslinked beads gives about the same amount of residual solvent when coated at 9.14 m/min as the control does at 4.57 m/min, i.e., it dries about twice as fast. This composition was also compared with a control coating used as a dry film photoresist. Similar results were obtained for photospeed and quality of etching and of plating, and in stripping of the photopolymer layer from the completed circuit as described in Example 1. The elongation to break of the lab coating was 570%.

EXAMPLE 3

A coating composition was prepared as follows:

|  | Parts |
|---|---|
| Crosslinked beads as described in Ex. 1 | 55.52 |
| Trimethylolpropane triacrylate | 13.10 |
| Tetraethylene glycol diacrylate | 13.10 |
| High molecular weight polymethylmethacrylate[3] | 6.620 |
| Michler's ketone | 0.106 |
| Benzophenone | 3.517 |
| Bis(2-o-chlorophenyl-4,5-bis-phenyl) imidazole | 2.193 |
| Tris-(4-diethylamino-o-tolyl) methane | 0.132 |
| 4,4'4''-Methylidyne tris (N,N—dimethyl aniline) | 0.088 |
| Victoria Green, C.I. Pigment Green 18 | 0.031 |
| Monostral Green Pigment, C.I. Pigment Green 7 | 0.098 |
| Mixture of ortho and para-toluene sulfonamide | 5.275 |
| Benzotriazole | 0.176 |
| p-Toluene sulfonic acid | 0.044 |
| Total | 100.000 |
| Solvent, $CH_2Cl_2$ | 196.2 |

[3]Intrinsic viscosity, 2.7

The beads are added as a 28.9% slurry in methylene chloride and the polymethylmethacrylate as 9% solution. These compositions are combined (already contained required amount of solvent) and the remaining ingredients are added. The coating composition contains 33.8% active ingredients.

A control coating composition was prepared like Coating Dispersion A of Example 1, except that instead of the mixture of methylene chloride and 2-ethoxyethanol, the solvent was 20732 g of pure methylene chloride to give a solution with 33.8% active ingredients. Drying rates are compared as in Example 1, using the same coater and three-stage dryer, and coating 50.8 micrometers thick as in Example 1. The amount of residual solvent from the bead-containing composition is significantly lower when coated at 10.67 m/min than the control coated at 4.57 m/min and is 0.10% as compared to 0.20% of the control. The dry coating was laminated to copper board and processed as described in Example 1 to give a copper circuit on the board. The elongation to break of a dry coating composition is 700%.

EXAMPLE 4

The preparation of crosslinked beads as described in Example 1 is repeated, except that instead of 500 g of trimethylpropane triacrylate, 500 g of triethylene glycol diacrylate is used in one experiment (F) and a mixture of 250 g of trimethylolpropane triacrylate and 250 g of triethylene glycol diacrylate is used in another experiment (G). Coating compositions are prepared like those of Coating Dispersion B, Example 1, except that in one, the crosslinked beads used are those of Coating Dispersion G and in a second one, those of Coating Dispersion F. A coating composition like Coating Dispersion A in Example 1 is coated as a control. The results are similar to those described above for the coating dispersion containing the crosslinked beads (G); at 11 m/min the residual solvent is about 0.4%, while Coating Dispersion A again requires about 5 m/min to achieve that level. In the case of the crosslinked beads (F), however, the rate of drying must be reduced almost to the rate for Coating Dispersion A to secure the 0.4% level of residual solvent. Upon applying the swelling test described in U.S. Pat. No. 4,414,278, it is found that the crosslinked beads G do not swell in methylene chloride whereas the crosslinked beads (F) swell about 40% in this test. This example using crosslinked beads (F) is repeated except that the methylene chloride solvent is replaced by an equal volume of 1,1,1-trichloroethane, in which beads (F) do not swell according to the swelling test. A coating composition is made similar to Coating Dispersion A, but using 1,1,1-trichloroethane instead of methylene chloride. The drier temperature is raised to accommodate the higher-boiling solvent. The 1,1,1-trichloroethane coating dispersion made like Coating Dispersion A dries at approximately 5 m/min. and the Coating Dispersion with beads (F) at approximately 10 m/min for a residual solvent control of 0.4%. That is, the drying is twice as fast to attain a 0.4% solvent level. These compositions are laminated to copper as described above, and a suitable photoresist image obtained on the copper after exposure and development. The elongation to break of the dry coating compositions corresponding to F and G is greater than 400%.

EXAMPLE 5

An electrical printed circuit is made as follows: twelve parts of 2-diazo-1-naphthol-4-sulfonyl chloride prepared as described in U.S. Pat. No. 3,837,860 is added to 20 parts of dioxane, and the mixture is slowly added to a 50 parts dioxane solution containing 2.0 parts of a copolymer of methyl methacrylate and hydroxymethyl methacrylate (90/10). The addition of 10 parts of a 1% solution of sodium carbonate turns the solution purple. A copolymer is thereby formed having pendent diazo quinone groups. The copolymer is precipitated with water, is collected and is dissolved in dioxane containing dispersed therein 9.3 parts of crosslinked polymeric beads as described in Example 1. This coating composition contains about 20.0% solids in dioxane and is coated as described in Example 1 onto a moving polyethylene terephthalate web at 4.57 m/min and is dried. The drying is appreciably faster than that of a similar coating composition containing 20% diazo quinone polymer without beads present. A sample of the dry coating composition containing the crosslinked polymer beads with its support film is laminated to a clean piece of copper-clad, epoxy-Fiberglass ® board with the surface of the photosensitive layer in contact with the copper surface. The lamination is carried out with the aid of rubber covered rollers at 120° C. The resulting resist covered element is image-exposed through a transparency with a positive image of the electrical circuit pattern on it for three minutes using a 500-watt mercury light source at a distance of 16 inches (40.64 cm). After exposure, the polyethylene terephthalate support film is stripped from the resist. The board is then developed by washing out the exposed areas with a 5% aqueous trisodium phosphate. This step leaves the resist on the copper in the pattern of the opaque areas of the exposing transparency, thus giving a positive image. The copper areas exposed by washout of the soluble resist corresponding to the clear areas of the exposing transparency are etched away down to the epoxy-Fiberglass® by placing the board in a 45° Baumé ferric chloride solution. This leaves the resist-covered copper conducting pattern on the Fiberglass® board. The reist is finally removed from the copper circuit using a commercially available stripping agent of methanol and dichloromethane 10/90.

CONTROL EXAMPLE 1

This is a control example. Two coating compositions are prepared as follows:

|  | Parts | |
| --- | --- | --- |
|  | D (Control) | E |
| Copolymer of styrene/maleic anhydride (1.4/1.0) esterified with a butanol mixture, molecular weight 10,000, Acid No. 190 | 30.00 | 4.05 |
| Copolymer of methyl methacrylate (71%)/-ethyl acrylate (17%)/-acrylic acid (12%), molecular weight 200,000, acid No. 100, glass transition temp 70° C. | 20.0 | 2.69 |
| Copolymer of methyl methacrylate(55)/ethyl acrylate(35)/acrylic acid(10), molecular weight 30,000, acid No. 80, glass transition temp. 50° C. | 14.72 | 1.98 |
| Crosslinked beads as described in Ex. 1 |  | 56.00 |
| Trimethylol propane triacrylate | 27.00 | 27.00 |
| Michler's ketone | 0.50 | 0.50 |
| Benzophenone | 5.00 | 5.00 |
| Bis(2-o-chlorophenyl-4,5 bis-phenyl) imidazole | 2.00 | 2.00 |
| Tris-(4-diethylamino-o-tolyl) methane | 0.20 | 0.20 |
| Benzotriazole | 0.40 | 0.40 |
| Victoria Green, C.I. Pigment Green 18 | 0.05 | 0.05 |
| 1,4,4-Trimethyl-2,3-diazabicyclo (3.2.2)-non-2-ene 2,3-dioxide | 0.03 | 0.03 |
| p-Toluene sulfonic acid | 0.10 | 0.10 |
| Total | 100.00 | 100.00 |
| Methylene chloride | 186.60 | 186.60 |
| Methanol | 16.23 | 16.23 |

Coatings are made as described in Example 1 and also at 4.0 m/min and at 12.2 m/min. The total residual solvent for Coating Dispersion E at 12.2 m/min is still lower than that for Coating Dispersion D at 4.0 m/min (0.3%). That is, the time required to dry Coating Dispersion E to a residual solvent level of 0.3% is less than one-third of the time required to dry Coating Dispersion D to that same level. Both coatings are laminated to copper, exposed 30 seconds through a transparency with a 2000 watt Berkey-Ascor mercury-xenon arc, developed for 30 seconds in the spray-processor described in Example 1 with 1% aqueous sodium carbonate at 43° C., rinsed and dried to give a photoresist image on the surface of the copper. The elongation to break of the dry coating compositions was: 245% for D and 10% for E (layer thickness of E was 0.12 inch (0.30 mm). This low elongation value for E indicates a brittle coating. This control shows that relatively low molecular weight polymeric binders cannot be replaced by about 85% crosslinked beads.

CONTROL EXAMPLE 2

Three coating dispersions were prepared. Two coating dispersion were Coating Dispersions A and B prepared as described in Example 1. The third coating dispersion was Coating Dispersion M prepared in a manner identical to the preparation of Coating Dispersion B but using polyethylene beads of about 2.0 μm mean particle size. The coating M was observed to be very brittle. A 0.006 inch (0.15 mm) or 0.02 inch (0.30 mm) laminate was very difficult to manipulate without breaking, similar to coating E of Control Example 1.

We claim:

1. A photosensitive coating composition consisting essentially of
    (a) 5 to 45% by weight based on the weight of components (a) to (d) of at least one nongaseous, ethylenically unsaturated compound having at least one terminal ethylenic group, said compound being capable of forming a high polymer by free-radical initiated, chain-propagating addition polymerization;
    (b) 0.05 to 10% by weight based on the weight of components (a) to (d) of an organic, radiation-sensitive, free-radical generating system, activatable by actinic radiation which initiates polymerization of the unsaturated compound;
    (c) at least one organic polymeric binder;
    (d) discrete, substantially nonswellable crosslinked polymeric beads having an average diameter in the range of 0.02 to 4.0 μm, wherein at least 90% of the beads by population are below 6 μm, the beads being insoluble and nonagglomerating in a solvent for the organic polymeric binder component, said crosslinked polymeric beads are taken from the class consisting of homopolymers and copolymers of tri-, and tetraacrylate, and tri-, and tetramethacrylate monomers which contain three or more free-radical polymerizable double bonds per molecule, copolymers of at least one of said acrylate and methacrylate monomers and up to 25% by weight of at least one monomer having one terminal ethylenic group, and copolymers of at least one of said acrylate and methacrylate monomers and up to 75% by weight of at least one monomer having two terminal ethylenic groups, the total weight percent of the combination of components (c) and (d) based on the total weight of components (a) to (d) being 40 to 70% by weight, component (d) being present in an amount of 15 to 90% by weight based on the weight of components (c) and (d); and
    (e) at least one solvent for components (a), (b) and (c), the crosslinked polymeric beads being resistant to absorbing or being plasticized by any component or mixture of components of the coating composition, being mutually compatible with the dissolved ingredients a, b, c and e of the coating composition in which said beads are dispersed.

2. A photosensitive coating composition according to claim 1 wherein the crosslinked polymeric beads are trimethylolpropane triacrylate beads.

3. A photosensitive coating composition according to claim 1 wherein the crosslinked polymeric beads have their surface hydrolyzed.

4. A photosensitive coating composition according to claim 3 wherein the hydrolyzed surface contains acidic groups.

5. A photosensitive coating composition according to claim 3 wherein the surface of the beads is treated with sodium hydroxide or potassium hydroxide.

6. A photosensitive coating composition according to claim 1 wherein the organic polymeric binder is at least one polymethylmethacrylate polymer having an intrinsic viscosity in a range from 0.5 to 3.0.

7. A photosensitive coating composition according to claim 1 wherein the binder (c) is an aqueous soluble binder.

8. A photosensitive coating composition according to claim 1 wherein the solvent for the binder is an organic solvent.

9. A photosensitive coating composition according to claim 8 wherein the organic solvent for the binder is taken from the group consisting of methylene chloride, 2-ethoxyethanol, methanol or a combination thereof.

* * * * *